United States Patent [19]

Morgan

[11] 3,904,499

[45] Sept. 9, 1975

[54] SOLID CURABLE COMPOSITIONS CONTAINING LIQUID POLYENES AND SOLID STYRENE-ALLYL ALCOHOL COPOLYMER BASED POLYTHIOLS

[75] Inventor: Charles R. Morgan, Silver Spring, Md.

[73] Assignee: W. R. Grace & Co., New York, N.Y.

[22] Filed: Feb. 25, 1974

[21] Appl. No.: 445,750

Related U.S. Application Data

[62] Division of Ser. No. 250,553, May 5, 1972, Pat. No. 3,843,572.

[52] U.S. Cl. ................ 204/159.15; 96/33; 96/35.1; 96/36.2; 96/36.3; 96/36.4; 96/115 P; 96/115 R; 117/93.31; 161/247; 204/159.14; 204/159.16; 204/159.17; 204/159.18; 260/77.5 CR; 260/77.5 TB; 260/17 R; 260/874; 260/875

[51] Int. Cl. ............................ B01j 1/10; B01j 1/12

[58] Field of Search..... 204/159.14, 159.15, 159.18; 260/29, 17 R, 77.5 CR, 874, 875

[56] References Cited

UNITED STATES PATENTS

| | | | |
|---|---|---|---|
| 3,625,925 | 12/1971 | Oswald et al. | 204/159.18 |
| 3,661,744 | 5/1972 | Kehr et al. | 204/159.18 |
| 3,662,022 | 5/1972 | Land | 204/159.18 |
| 3,843,572 | 10/1974 | Morgan | 260/17 R |

*Primary Examiner*—Murray Tillman
*Assistant Examiner*—Richard B. Turer
*Attorney, Agent, or Firm*—Giedre M. McCandless

[57] ABSTRACT

Novel solid polythiols are mercaptoester derivatives of styrene-allyl alcohol copolymers. These solid polythiols are readily prepared by esterifying a styrene-allyl alcohol copolymer with a mercaptocarboxylic acid, e.g., β-mercaptopropionic acid. The solid styrene-allyl alcohol based polythiols may be admixed with liquid polyenes thereby forming solid polyene-polythiol polymeric systems which are curable, particularly photocurable, in the solid state. Upon exposing the solid, curable polyene-polythiol compositions to a free radical generator, e.g., UV light, solid cross-linked and chemically resistant polythioether products are formed which are particularly useful as coatings, photoresists, printing plates, etc.

9 Claims, No Drawings

SOLID CURABLE COMPOSITIONS CONTAINING LIQUID POLYENES AND SOLID STYRENE-ALLYL ALCOHOL COPOLYMER BASED POLYTHIOLS

BACKGROUND OF THE INVENTION

This is a division of application Ser. No. 250,553 filed May 5, 1972, now U.S. Pat. No. 3,843,572.

This invention relates to a solid styrene-allyl alcohol based polythiol composition. More particularly, this invention relates to solid, solvent soluble curable compositions comprising liquid polyenes-solid polythiols and method of preparing the same, as well as curing the solid polymer composition in the presence of a free radical generator to solid, cross-linked, solvent-insoluble materials. More specifically, this invention relates to solid photoresists and method of preparing same.

It is known that polyenes are curable by polythiols in the presence of free radical generators such as actinic radiation to solid polythioether containing resinous or elastomeric products. In these prior art polyene-polythiol curable systems, either both the polyenes and polythiol were liquids, or one of the polymeric components was solid and the other liquid. Both liquid curable systems and the liquid-solid curable polymeric systems possess certain limitations and disadvantages. The use of curable liquid systems in preparation of photoimaged surfaces such as relief printing plates and photoresists have many undesirable features such as time consuming liquid coating operation which involves the use of cumbersome and additional apparatus, particularly expensive liquid dispensing equipment. A particular disadvantage of the liquid polymer systems is the resulting limited resolution during the photoimaging step, since it is necessary to maintain an air gap between the image, e.g., photographic negative and the liquid photocurable composition coated on a surface which is to be imaged in order to avoid marring the image and allowing its reuse.

Additionally, in the manufacture of certain printed circuits, when various photosensitive polymers are applied as liquid photoresists they clog "thru-holes" in double sided or multi-layer printed circuits.

Since solid polythiols are not readily available, prior art polyene-polythiol curable systems are composed mostly of solid polyenes and liquid polythiols in which the components are often incompatible, are not easily workable, or do not produce dry films.

The novel solid curable polymer system of the present invention overcomes the numerous defects of prior art materials. The solid polythiols of this invention which are compatible with various liquid polyenes readily form solid curable compositions. These curable compositions can be compounded easily by mixing the liquid polyene and solid polythiols and be rapidly cured, particularly photocured in a solid state. These solid polythiol-liquid polyene mixtures are versatile photocurable compositions which are particularly useful in preparation of solid photoresists, solid relief or offset printing plates, coatings and the like. The subject photocurable polyene-polythiol compositions readily form dry solid film materials which can be easily handled and stored prior to utilizing than in photocuring processes such as photoresist formation. The dry film polymer composition can be readily laminated on a desired solid surface such as metal or metal clad substrate. In a photoimaging application such as photoresist formation, selective portions of the solid photocurable able polymer composition are photocured and insolubilized, thereby forming a protective coating which shows excellent adhesion to metal surfaces such as copper.

In accordance with this invention, solid curable polythiols containing at least two thiol groups per molecule can be easily prepared from styrene-allyl alcohol copolymer starting materials. These styrene-allyl alcohol copolymer based poly thiols, when admixed with liquid polyenes, form highly reactive compositions which are capable of being photocured when exposed to actinic radiation in the presence of a UV sensitizer to insoluble polythioether containing materials which exhibit excellent physical and chemical properties. For example, photoresist coating formed from cured polyene-polythiol composition containing styrene-allyl alcohol copolymer based polythiols and liquid polyenes are capable of withstanding severe chemical environments employed in the printed circuit board manufacturing processes. The subject cured materials resist strongly acid etching solutions or highly alkaline conditions of electroless metal plating baths. The desirable characteristics of the cured materials make the polyene-polythiol curable compositions containing styrene-allyl alcohol copolymer backbone based solid polythiol particularly useful in both subtractive and additive circuitry applications.

Generally speaking, the novel solid curable composition is comprised of a liquid polyene component containing at least 2 reactive carbon to carbon unsaturated bonds per molecule and a solid polythiol component containing at least two thiol groups, which is the reaction product of a styrene-allyl alcohol copolymer and a mercaptocarboxylic acid.

The formation of the solid polythiol may be represented by the non-limiting equation illustrating $\beta$-mercaptopropionic acid as the mercaptocarboxylic reactant:

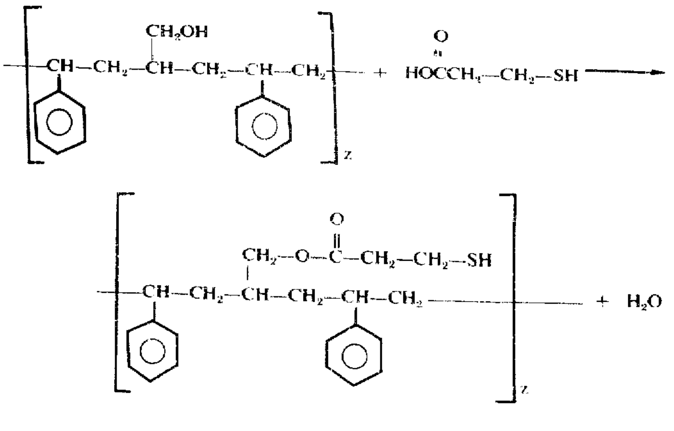

In the above equation, $z$ is at least 2.

It is to be noted that in the above equation no attempt to show structural arrangement of the polymer is to be inferred.

Broadly, the operable polythiol components of the solid curable composition are solid derivatives of styrene-allyl alcohol copolymers in which the reacting group is the hydroxyl functionality of the allyl alcohol portion of the copolymer. Operable solid polythiols are mercaptoester derivatives of styrene-allyl alcohol copolymers.

As used herein, styrene-allyl alcohol copolymers refer to copolymers of an ethylenically unsaturated alcohol and a styrene monomer. Operable styrene-allyl alcohol copolymers are those containing from about 30 to 94 percent by weight of the styrene monomer, and preferably 60 to 85 percent by weight and correspondingly, from about 70 to 6 percent by weight of the ethylenically unsaturated alcohol, and preferably from about 40 to 15 percent on the same basis. In general, styrene-allyl alcohol copolymers having from about 1.8 to 10 percent hydroxyl groups by weight, preferably 4 to 8 percent.

The actual hydroxyl group content of the aforesaid copolymers may not always conform to the theoretical content calculated from the relative proportions of styrene monomer and ethylenically unsaturated alcohol, due to possible destruction of hydroxyl groups during copolymerization.

The styrene monomer moiety of said copolymer may be styrene or a ring-substituted styrene in which the substituents are 1–4 carbon atom alkyl groups or chlorine atoms. Examples of such ring-substituted styrenes include the ortho-, meta- and para-, methyl, ethyl, butyl, etc., monoalkyl styrenes; 2,3- 2,4-dimethyl and diethyl styrenes; mono-, di- and tri-chlorostyrenes; alkylchlorostyrenes such as 2-methyl-4-chlorostyrene, etc. Mixtures of two or more of such styrene monomer moieties may be present. The ethylenically unsaturated alcohol moiety may be allyl alcohol, methallyl alcohol, or a mixture thereof. For the purposes of brevity and simplicity of discussion, the entire class of copolymers set forth in this paragraph shall hereinafter be referred to simply as styrene-allyl alcohol copolymers.

The styrene-allyl alcohol copolymers may be prepared in several ways. One operable method which yields styrene-allyl copolymer starting materials which are solid products is taught in U.S. Pat. No. 2,630,430. A more desirable method of copolymerizing the styrene and allyl alcohol components in a substantially oxygen-free composition, thus minimizing the oxidative loss of hydroxyl groups, is disclosed in U.S. Pat. No. 2,894,938.

Furthermore, the suitable styrene-allyl alcohol copolymers are generally commercially available materials.

The aforedescribed styrene-allyl alcohol copolymers are operable starting materials for the formation of the solid polythiols.

As used herein, polyenes and polyynes refer to simple or complex species of alkenes or alkynes having a multiplicity of pendant or terminally reactive carbon to carbon unsaturated functional groups per average molecule. For example, a diene is a polyene that has two reactive carbon to carbon double bonds per average molecule, while a diyne is a polyyne that contains two reactive carbon to carbon triple bonds per average molecule; a carbon to carbon unsaturation is located terminal in a branch of the main chain as contrasted to a position at or near the ends of the main chain. For purposes of brevity, all of these positions are referred to herein generally as terminal unsaturation.

Functionality as used herein refers to the average number of ene or thiol groups per molecule in the polyene or polythiol, respectively. For example, a triene is a polyene with an average of three reactive carbon to carbon unsaturated groups per molecule, and thus has a functionality $f$ of 3. A dithiol is a polythiol with an average of two thiol groups per molecule and thus has a functionality $f$ of 2.

The term reactive unsaturated carbon to carbon groups means groups which will react under proper conditions as set forth herein with thiol groups to yield the thioether linkage $$(-\overset{|}{\underset{|}{C}}-S-\overset{|}{\underset{|}{C}}-),$$

as contrasted to the term unreactive carbon to carbon unsaturation which means $$-\overset{|}{C}=\overset{|}{C}-$$

groups found in aromatic nuclei (cyclic structures exemplified by benzene, pyridine, anthracene, and the like) which do not under the same conditions react with thiols to give thioether linkages. For purposes of brevity, this term will hereinafter be referred to generally as reactive unsaturation or a reactive unsaturated compound.

As used herein, the term polyvalent means having a valence of two or greater.

The polythiol component of the solid curable composition is solid mercaptoester having at least two thiol groups per molecule. The polythiol is a reaction product of a styrene-allyl alcohol copolymer and at least one mercaptocarboxylic acid. The polythiols have a molecular weight in the range from about 472 to 20,000, preferably 1,300 to 8,000, and may be represented by the following general formula:

$$E\left[-O-\overset{O}{\overset{\|}{C}}-R_3-SH\right]_x$$

wherein $x$ is an integer of at least 2, and preferably from 4 to 10, and E is a styrene-allyl alcohol copolymeric moiety remaining after removal of $n$ hydroxyl groups from a said styrene-allyl alcohol copolymer, thereby forming $x$ ester linkages; $R_3$ is a polyvalent organic radical member free of reactive carbon to carbon unsaturation and contains group members such as aryl, substituted aryl, aralkyl, substituted aralkyl, cycloalkyl, substituted cycloalkyl, alkyl and substituted alkyl groups containing 1 to 16 carbon atoms.

Preferred examples of operable aryl members are either phenyl or naphthyl, and of operable cycloalkyl members which have from 3 to 8 carbon atoms. Likewise, preferred substitutents on the substituted members may be such groups as chloro, bromo, nitro, acetoxy, acetamido, phenyl, benzyl, alkyl and alkoxy of 1 to 9 carbon atoms, and cycloalkyl of 3 to 8 carbon atoms.

Operable mercaptocarboxylic acids include but are not limited to thioglycollic acid (mercaptoacetic acid), α-mercaptopropionic acid, β-mercaptopropionic acid, 4-mercaptobutyric acid, mercaptovaleric acids, mercaptoundecyclic acid, mercaptostearic acid, and o- and p-mercaptobenzoic acids. Preferably, thioglycollic or β-mercaptopropionic acid is employed. Mixtures of various mercaptocarboxylic acids are operable as well.

The polythiol esters are prepared by the esterification of the styrene-allyl alcohol with mercaptocarboxylic acid in the presence of an acid catalyst, the water formed during the reaction being removed as an azeotrope in a suitable solvent. The reaction is carried out in an inert, moisture-free atmosphere at atmospheric pressure at a temperature in the range of from 60° to about 150°C, preferably from 60° to 110°C for a period of 30 minutes to about 24 hours.

Suitable acid catalysts include but are not limited to p-toluenesulfonic acid, sulfuric acid, hydrochloric acid and the like. Useful inert solvents include but are not limited to saturated aliphatic hydrocarbons, aromatic hydrocarbons, chlorinated hydrocarbons, ethers, ketones, etc. Representative non-limiting examples of solvents include toluene, benzene, xylene, chloroform, 1,2-dichloroethane, etc.

One group of liquid polyenes operable in the instant invention to react with the solid polythiols to form curable compositions is that taught in a copending application having Ser. No. 617,801, filed Feb. 23, 1967, now abandoned, assigned to the the same assignee and incorporated herein by reference. This group includes those having molecular weight in the range of 50 to 20,000, a viscosity ranging from slightly above 0 to about 20 million centipoises at 70°C. of the general formula $[A]—(X)_m$ wherein X is a member of the group consisting of

and R—C ≡ C—; *m* is at least 2; R is independently selected from the group consisting of hydrogen, halogen, aryl, substituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amounts of hetero atoms such as N, S, P or O, but contains primarily carbon-carbon, carbon-oxygen or silicon-oxygen chain linkages without any reactive carbon to carbon unsaturation.

Examples of operable polyenes from this group include, but are not limited to 1. crotyl-terminated polyurethanes which contain two "reactive" double bonds per average molecule in a near terminal position of the average general formula:

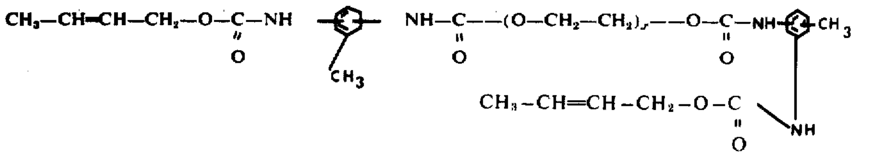

wherein *x* is at least 1, 2. the following structure which contains terminal "reactive" double bonds:

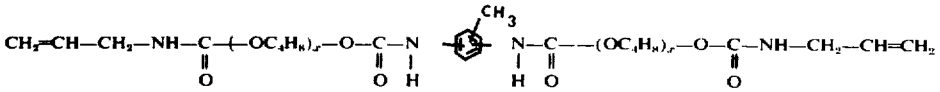

where *x* is at least 1, 3. the following structure which contains terminal "reactive" double bonds:

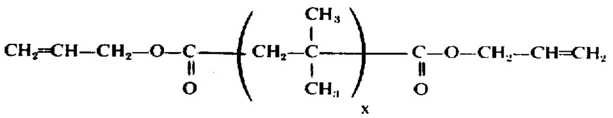

where *x* is at least 1, and 4. the following structure which contains near terminal "reactive" double bonds:

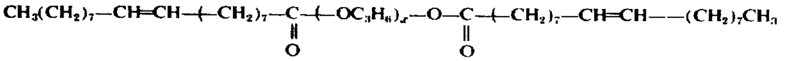

where *x* is at least 1.

A second group of polyenes operable in the instant invention includes unsaturated polymers in which the double or triple bonds occur primarily within the main chain of the molecules. Examples include conventional liquid polyunsaturated polymers (derived primarily from standard diene monomers) such as polyisoprene, polybutadiene, styrene-butadiene-acrylonitrile and the like; liquid unsaturated polyesters, polyamides, and polyurethanes derived from monomers containing "reactive" unsaturation, e.g., adipic acid-butenediol, 1,6-hexanediamine-fumaric acid and 2,4-tolylene diisocyanate-butenediol condensation polymer and the like.

A third group of polyenes operable in this invention includes those polyenes in which the reactive unsaturated carbon to carbon bonds are conjugated with adjacent unsaturated groupings. Examples of operable reactive conjugated ene systems include, but are not limited to, the following:

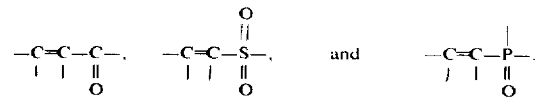

A few typical examples of polymeric polyenes which contain conjugated reactive double bond groupings such as those described above are polyethyeleneether glycol diacrylate having a molecular weight of about 750, polytetramethyleneether glycol dimethacrylate having a molecular weight of about 1175, the triacrylate of the reaction product of trimethylolpropane with 20 moles of ethylene oxide and the like.

The above three groups of operable liquid polyenes are disclosed in U.S. Pat. No. 3,623,879, said pertinent portions relating to these compounds and preparation thereof, in said patent being incorporated herein by reference.

Included in the term "polyenes" as used herein are those materials which fall within the viscosity ranging from slightly above 0 to about 20 million centipoises at 70°C.

Examples of operable liquid polyenes which can be cured with the solid polythiols of this invention include, but are not limited to, the reaction product of polytetramethylene ether glycol having a molecular weight of about 2,000, tolylene diisocyanate and allyl isocyanate in a mole ratio of 1:1:1:2 respectively; the reaction product of polytetramethylene ether glycol having a molecular weight in the range of about 650 to about 1,000 and allyl isocyanate in a mole ratio of 1:2 respectively; the reaction product of a polyester diol and allyl isocyanate in a mole ratio of 1:2 respectively; the reaction product of polyoxypropylene diol having a molecular weight in the range of about 700–4,000, tolylene 2,4-diisocyanate and allyl alcohol in a mole ratio of 1:2:2 respectively; the reaction product of a phthalate or succinate esterol derived from polytetramethylene ether glycol and allyl isocyanate having a molecular weight of about 4,000; the reaction product of polyethylene ether glycol having a molecular weight in the range of about 500 to 1,000 and allyl isocyanate in a mole ratio of 1:2 respectively; the reaction product of polyoxypropylene triol having a molecular weight in the range of about 3,000 to 6,000 and allyl isocyanate in a mole ratio of 1:3 respectively, poly-1,3-butadiene; the triacrylate of the reaction product of trimethylol propane and ethylene oxide; triallyl urea; cellulose acetate methacrylate; the reaction product of 1,4-butanediol and allyl isocyanate in a mole ratio of 1:2 respectively; the reaction product of poly(tetramethyleneether) glycol, tolylene diisocyanate and allyl alcohol in a mole ratio of 1:2:2 respectively; and the polyene formed by reacting either (a) an organic epoxide containing at least two

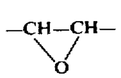

groups in its structure with a member of the group consisting of hydrazine, primary amines, secondary amines, tertiary amine salts, organic alcohols and organic acids wherein said group members contain at least one organic substituent containing a reactive ethylenically or ethynylically unsaturated group, or, (b) an organic epoxide containing at least one organic substituent containing a reactive ethylenically or ethynylically unsaturated group with a member of the group consisting of hydrazine and an organic material containing at least two active hydrogen functions from the group consisting of

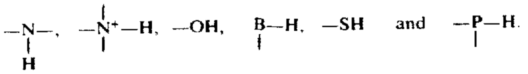

A specific example of the latter group of polyenes formed from epoxy compounds is the liquid reaction product of diglycidyl ether of Bisphenol A having a molecular weight in the range of about 370 to 384 and diallyl amine in a mole ratio of 1:2 respectively.

In summary, by admixing the novel solid styrene-allyl alcohol polymer based polythiols with various liquid polyenes and thereafter exposing the solid mixture at ambient conditions to a free radical generator, a solic, cured polythioether product is obtained.

Prior to curing the solid polyene and polythiol, components are admixed in a suitable manner so as to form a homogeneous solid curable mixture. Thus, the polyene and polythiol reactants may be dissolved in a suitable solvent and thereafter the solvent can be removed by suitable means such as evaporation.

To obtain the maximum strength, solvent resistance, creep resistance, heat resistance and freedom from tackiness, the reactive components consisting of the polyenes and polythiols are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of various liquid polyenes and various solid polythiols containing said functionality are also operable herein.

The solid compositions to be cured in accord with the present invention may, if desired, include such additives as antioxidants, accelerators, dyes, inhibitors, activators, fillers, thickeners, pigments, anti-static agents, flame-retardant agents, surface-active agents, extending oils, plasticizers and the like within the scope of this invention. Such additives are usually pre-blended with the polyene or polythiol prior to or during the compounding step. The aforesaid additives may be present in quantities up to 500 or more parts based on 100 parts by weight of the polyene-polythiol curable compositions and preferably 0.005–300 parts on the same basis.

The solid polythioether-forming components and compositions, prior to curing may be admixed with or blended with other monomeric and polymeric materials such as thermoplastic resins, elastomers or thermosetting resin monomeric or polymeric compositions. The resulting blend may be subjected to conditions for curing or co-curing of the various components of the blend to give cured products having unusual physical properties.

Although the mechanism of the curing reaction is not completely understood, it appears most likely that the curing reaction may be initiated by most any free radical generating source which dissociates or abstracts a hydrogen atom from an SH group, or accomplishes the equivalent thereof. Generally, the rate of the curing reaction may be increased by increasing the temperature of the composition at the time of initiation of cure. In many applications, however, the curing is accomplished conveniently and economically by operating at ordinary room temperature conditions.

Operable curing initiators or accelerators include radiation such as actinic radiation, e.g., ultraviolet light, lasers; ionizing radiation such as gamma radiation, X-rays, corona discharge, etc.; as well as chemical free radical generating compounds such as azo, peroxidic, etc., compounds.

Azo or peroxidic compounds (with or without amine accelerators) which decompose at ambient conditions are operable as free radical generating agents capable of accelerating the curing reaction include benzoyl peroxide, di-t-butyl peroxide, cyclohexanone peroxide with dimethyl aniline or cobalt naphthenate as an accelerator; hydroperoxides such as hydrogen peroxide, cumene hydroperoxide, t-butyl hydroperoxides; peracid compounds such as t-butylperbenzoate, peracetic acid; persulfates, e.g., ammonium persulfate; azo compounds such as azobis-isobutyronitrile and the like.

These free radical generating agents are usually added in amounts ranging from about 0.001 to 10 percent by weight of the curable solid polyene-polythiol composition, preferably 0.01 to 5 percent.

The curing period may be retarded or accelerated from less than 1 minute to 30 days or more.

Conventional curing inhibitors or retarders which may be used in order to stabilize the components or curable compositions so as to prevent premature onset of curing may include hydroquinone; p-tert-butyl catechol; 2,6-di tert-butyl-p-methylphenol; phenothiazine; N-phenyl-2-naphthylamine; phosphorous acid; pyrogallol and the like.

The preferred free radical generator for the curing reaction is actinic radiation, suitably in the wavelength of about 2,000 to 7,500A, preferably for 2,000 to 4,000A.

A class of actinic light useful herein is ultraviolet light, and other forms of actinic radiation which are normally found in radiation emitted from the sun or from artifical sources such as Type RS Sunlamps, carbon arc lamps, xenon arc lamps, mercury vapor lamps, tungsten halide lamps and the like. Ultraviolet radiation may be used most efficiently if the photocurable polyene/polythiol composition contains a suitable photocuring rate accelerator. Curing periods may be adjusted to be very short and hence commercially economical by proper choice of ultraviolet source, photocuring rate accelerator and concentration thereof, temperature and molecular weight, and reactive group functionality of the polyene and polythiol. Curing periods of less than about 1 second duration are possible, especially in thin film applications such as desired, for example, in coatings, adhesives and photoimaged surfaces.

Various photosensitizers, i.e., photocuring rate accelerators are operable and well known to those skilled in the art. Examples of photosensitizers include, but are not limited to, benzophenone o-methoxybenzophenone, acetophenone, o-methoxyacetophenone, acenaphthene-quinone, methyl ethyl ketone, valerophenone, hexanophenone, γ-phenylbutyrophenone, p-morpholinopropiophenone, dibenzosuberone, 4-morpholinobenzophenone, benzoin, benzoin methyl ether, 4'-morpholinodeoxybenzoin, p-diacetylbenzene, 4-aminobenzophenone, 4'-methoxyacetophenone, benzaldehyde, o-methoxybenzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthenone, 7-H-benz[de]anthracen-7-one, 1-naphthaldehyde, 4,4'-bis(dimethylamino)-benzophenone, fluorene-9-one, 1'-acetonaphthone, 2'-acetonaphthone, triphenylphosphine, tri-o-tolylphosphine, acetonaphthone and 2,3-butanedione, benz[a]anthracene 7,12 dione, etc., which serve to give greatly reduced exposure times and thereby when used in conjunction with various forms of energetic radiation yield very rapid, commercially practical time cycles by the practice of the instant invention.

These photocuring rate accelerators may range from about 0.005 to 50 percent by weight of the solid photocurable polyene-polythiol composition, preferably 0.05 to 25 percent.

The mole ratio of the ene/thiol groups for preparing the solid curable composition is from about 0.1/1.0 to about 8/1.0, and preferably from 0.2/1.0 to about 1.5/1.0 group ratio.

The solid curable polyene-polythiol compositions containing styrene-allyl alcohol copolymer based solid polythiols are used in preparing solid, cured crosslinked insoluble polythioether polymeric products having many and varied uses, examples of which include, but are not limited to, coatings; adhesives; films; molded articles, imaged surfaces, e.g., solid photoresists; solid printing plates; e.g., offset, lithographic, letterpress, gravures, etc., silverless photographis materials and the like.

Since the cured materials formed from the liquid polyene-solid polythiol composition posses various desirable properties such as resistance to severe chemical and physical environments, they are particularly useful for preparing imaged surfaces.

A general method for preparing coatings, particuarly imaged surfaces such as photoresists, printing plates, etc., comprises coating the solid curable composition on a solid surface of a substrate such as plastic, rubber, glass, ceramic, metal, paper and the like; exposing image-wise either directly using "point" radiation or through an image bearing transparency, e.g., photographic negative or positive or a mask, e.g., stencil, to radiation, e.g., U.V. light until the curable composition cures and cross-links in the exposed areas. After image-wise exposure, the uncured, unexposed areas are removed, e.g., with an appropriate solvent, thereby baring the unprotected surface of the substrate in selected areas. The resulting products are cured latent images on suitable substrates or supports. In case or preparing printing plates, e.g., a flexible relief plate wherein the substrate is usually a plastic material, the imaged product is ready for use. However, in other cases, e.g., in printed circuit manufacture or in chemical milling, the cured polymer composition acts as a photoresist.

The solid curable polyene-polythiol compositions of the subject invention are extremely suitable for use as a photoresist composition since (1) it adheres to the substrate firmly and readily on photocuring, (2) is resistant to the etching and plating environments for the substrate as well as soldering environments and (3) is easily removed by a solvent which does not affect the protected area.

Thus, in the preparation of an imaged surface by one operable photoresist process, the solid photocurable polyene-polythiol composition is coated or laminated onto an etchable solid surface, preferably a metal or metal clad substrate, as a solid, tack-free layer; exposed through an image bearing transparency to a free radical generator such as actinic radiation suitably in the wavelength range from about 2,000 to 7,500A or ionizing radiation to selectively cure the exposed portion of the composition, thus baring the metal beneath the removed uncured portion of the composition, optionally removing the exposed metal from the substrate to the desired depth and thereafter optionally removing the cured composition, thus leaving defined metal areas on the substrate.

In the printed circuit board manufacturing processes, the solid surface or board is usually electrically insulating substrate such as ceramic, thick plastic, epoxy, glass, etc., which can be clad with an etchable metal such as copper, aluminum, nickel, stainless steel and the like.

The above process illustrates the use of the solid photoresist in substractive circuitry applications, however, the subject solid photoresist compositions are very satisfactory for use in additive circuitry applications which utilize electroless metal plating processes which generally have highly caustic plating baths and thus require an extremely resistant photoresist material. Typically electroless metal plating baths, as well as conventional sensitizing and activating solutions utilized in additive circuit processes are disclosed in U.S. Pat. Nos. 3,546,009 and 3,573,973.

Various metals such as copper, nickel, gold, silver, tin, lead, etc., may be plated on metal clad substrates by conventional metal depositing techniques other than electroless plating, such as electroplating, chemical vapor deposition, flow soldering coating techniques and the like. The subject photocured resist composition are capable of withstanding the various metal depositing environments.

The solid film of photocurable composition can be formed by coating a solution or dispersion onto the metal cladding of a substrate and drying the layer by removal of the solvent by any suitable means, such as evaporation. The solid photoresist compositions may also be melted and suitably applied directly onto the metal surface of a metal clad substrate. Coating may be carried out by any of the conventional coating procedures such as spraying, dip coating, roller coating or curtain coating.

The photocurable resist layer has usually a dry coating thickness of about 1 mil, although it may range from 0.015 to about 5 mils or more.

In forming the solid photoresist composition comprised of the solid polythiol and liquid polyene, it is desirable that the photocurable composition contain a photocuring rate accelerator from about 0.005 to 50 parts by weight based on 100 parts by weight of the aforementioned polyene and polythiol.

It is to be understood, however, that when energy sources, e.g., ionizing radiation, other than visible or ultraviolet light, are used to initiate the curing reaction, photocuring rate accelerators (i.e., photosensitizers, etc.) generally are not required in the formulation.

When U.V. radiation is used for the curing reaction, a dose of 0.0004 to 6.0 watts/cm$^2$ is usually employed.

The thickness of the metal or metal cladding on the substrates may vary from 0.1 mil to 20 mils, depending on the desired end use.

The following examples will aid in explaining, but should not be deemed limiting, the instant invention. In all cases unless otherwise noted, all parts and percentages are by weight.

FORMATION OF SOLID POLYTHIOLS

Example 1

220 g of a copolymer of styrene allyl-alcohol having an equivalent weight of about 220 and a hydroxyl content of about 7.7 percent and commercially available from Monsanto Company under the tradename RJ 101, and 106 g of $\beta$-mercaptopropionic acid along with 400 ml of benzene as a solvent and 2.0 g of p-toluenesulfonic acid as a catalyst were charged to a resin kettle equipped with a stirrer, condenser, Dean-Stark trap, thermometer and gas inlet and outlet. The mixture was heated to reflux and the benzene-water azeotrope was collected. The amount of water obtained was about 18 ml. The reaction mixture was then vacuum-stripped to remove the benzene. The mixture was then dried in a vacuum oven at 40°C resulting in a white rubbery solid polythiol having a styrene-allyl alcohol copolymer based polymeric backbone which had a mercaptan content of 2.65 meq/g. This polythiol will hereinafter be referred to as Polythiol A.

Example 2

Example 1 was repeated except that 2.0 g of sulfuric acid instead of p-toluenesulfonic acid was employed as a catalyst. The results were substantially the same as in Example 1.

Example 3

Example 1 was repeated except that 300 g of a copolymer of styrene-allyl alcohol having an equivalent weight of about 300 and a hydroxyl content of about 5.7 percent and commercially available from Monsanto Company under the tradename RJ 100, instead of the RJ 101 was employed as the styrene-allyl alcohol copolymeric backbone. The resulting rubbery solid polythiol had a mercaptan content of about 2.38 meq/g and will hereinafter be referred to as Polythiol B.

Example 4

110 g of a copolymer of styrene allyl-alcohol having an equivalent weight of about 220 and a hydroxyl content of about 7.7 percent and commercially available from Monsanto Company under the tradename RJ 101, and 46 g of mercaptoacetic acid along with 250 ml of benzene as solvent and 1.0 g of p-toluenesulfonic acid as a catalyst were charged to a resin kettle equipped with a stirrer, condenser, Dean-Stark trap, thermometer and gas inlet and outlet. The mixture was heated to reflux and the benzene-water azeotrope was collected. The amount of water obtained was about 11 ml. The reaction mixture was then vacuum-stripped to remove most of the benzene. The mixture was poured into petroleum ether in a blender to precipitate a solid which was dried in a vacuum oven at 40°C resulting in a rubbery, non-tacky solid polythiol ester having a styrene-allyl alcohol based polymeric backbone. This polythiol which had a mercaptan content of 2.94 meq/g will hereinafter be referred to as Polythiol C.

FORMATION OF POLYENE PREPOLYMERS

Example 5

2.0 moles of trimethylolpropane diallyl ether and 0.2 g. of dibutyltin dilaurate as a catalyst were charged to a resin kettle maintained under nitrogen and equipped with a stirrer, thermometer, dropping funnel and a glas inlet and outlet. 1.0 mole of tolylene diisocyanate was added slowly with stirring and the reaction temperature was maintained at 70°C by means of a water bath for the flask. After the addition of the tolylene diisocyanate, the reaction was continued for about 1 hour at 70°C until the NCO content was substantially zero. The thus formed allyl terminated liquid prepolymer will hereinafter be referred to as Polyene A.

Example 6

1 mole of a commercially available liquid polymeric diisocyanate sold under the tradename "Adiprene L 100" by E. I. DuPont de Nemours & Co., was charged to a resin kettle equipped with a condenser, stirrer, thermometer and a gas inlet and outlet along with 4 grams of dibutyltin dilaurate as a catalyst. 2 moles of allyl alcohol was slowly added to the kettle during which time the exotherm and reaction temperature was maintained below 80°C. After the addition of the allyl alcohol was completed the reaction was continued for 15 hours at 70°C under nitrogen. The thus formed allyl terminated liquid prepolymer will hereinafter be referred to as Polyene B.

CURING PROCESS

Example 7

To a solution containing 37.0 g of solid Polythiol A from Example 1 and 58.0 g of 1,2-dichloroethane were added 7.5 g of liquid Polyene A from Example 5, 0.44 g of dibenzosuberone and 0.016 of phosphorous acid. The thus formed solution was applied uniformly onto a about 5 mil thick polyethylene terephthalate, i.e., "Mylar" film in a layer of approximately 1.0 mil thickness by means of a drawbar. The dichloroethane was allowed to evaporate leaving a solid photocurable coating of the admixture on the support film. Thereafter the solid photocurable coating on the "Mylar" film was brought in contact with the surface of the copper cladding of a clean copper clad epoxy-glass printed circuit board blank. Heat (60°C) and pressure are applied to make the laminate. A negative image-bearing transparency of a printed circuit was placed in contact with and over the "Mylar" film and the solid photocurable coating was exposed through the transparency and UV transparent polyethylene terephthalate film to UV radiation from a 8,000 watt Ascorlux pulsed xenon arc lamp at a surface intensity of 3,600 microwatts/cm$^2$ for about 5 minutes. The major spectral lines of this lamp are all above 3,000 A. The negative transparency was removed and the "Mylar" film was stripped off. The coating was washed in 1,1,1-trichloroethane to remove the unexposed, uncured portion thereof, thus exposing the copper thereunder.

The image coated circuit board was then etched by spraying with a ferric chloride solution 42° Baume for about 30 minutes at 40°C to remove the exposed copper, followed by a water wash. The cured photoresist coating which was not affected by the etching solution was left on the etched printed circuit board as a protective cover for the desired electrical circuit thereunder.

Example 8

An admixture of 10.25 g of solid polythiol A from Example 1, 2.5 g of liquid Polyene B from Example 6 and 0.1 g of dibenzosuberone was dissolved in about 30 g of chloroform. The solution was spin coated to the copper surface of a circuit board comprising a 0.001 inch thick copper cladding on a 0.050 inch epoxy-glass. The chloroform was allowed to evaporate leaving about a 1.0 mil solid non-tacky photocurable coating of the admixture on the copper. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 4,000 microwatts/cm$^2$ for about 2 minutes. The major spectral lines of this lamp are all above 3,000A. The negative transparency was removed and the coating was washed in 1,1,1-trichloroethane to remove the unexposed, uncured portion thereof, thus exposing the copper thereunder. The cured portion of the photocurable composition adhered as a photo resist on copper clad epoxy-glass board.

Example 9

To a solution containing 37.0 g of solid Polythiol A from Example 1, and 58.0 g of 1,2-dichloroethane were added 4.15 g of monomeric triallylisocyanurate, 0.4 g of benzophenone and 0.015 g of phosphorus acid. The solution was spin coated to the surface of a copper sheet about 1 mil thick. After the dichloroethane solvent evaporated, about a 1 mil solid, tack-free film of the photocurable composition was left on the copper. This solid photocurable film was then exposed directly to UV light from an 8,000 watt Ascorlux pulsed xenon arc lamp at a surface intensity of 4,000 microwatt/cm$^2$ for about 2 minutes. The major spectral lines of this lamp are all above 3,000A. The solid photocurable composition cured to a solid protective coating on the copper surface.

The molecular weight of the polyenes and polythiols of the present invention as well as the starting styrene-allyl alcohol copolymer materials of this invention may be measured by various conventional methods including solution viscosity, osmotic pressure and gel permeation chromatography. Additionally, the molecular weight may be calculated from the known molecular weight of the reactants.

As can be seen from the above detailed description, the subject solid curable and particularly photocurable compositions comprised of compatible liquid polyenes and solid polythiols having similar polymeric backbones based on styrene-allyl alcohol copolymers exhibit extremely satisfactory chemical and physical properties and are versatile curable polymeric systems which do not possess the many drawbacks of liquid curable polymer compositions.

A desirable characteristic of these solid photocurable polyene-polythiol compositions is that solid films of the same may be formed easily by known film forming techniques and the solid photosensitive film can be packaged as a sandwich between removable protective cover sheets such as polyolefin films and a flexible, usually UV transparent, support polymeric film composed of polyesters, cellulose esters, polyamides, etc. In this manner, they can be easily stored and handled and when ready for use can be directly laminated, usually under pressure and heat, to the desired solid surface, e.g., metal clad printed circuit board. The solid uncured polyene-polythiol composition adhere very satisfactorily to various surfaces, particularly to copper.

It is understood that the foregoing detailed description is given merely by way of illustration and that many variations may be made therein without departing from the spirit of this invention.

What is claimed is:

1. A solid curable composition useful for obtaining a solid cross-linked polythioether consisting essentially of:

1. a liquid polyene containing at least 2 reactive unsaturated carbon to carbon bonds and having a molecular weight in the range of about 50 to 20,000;
2. a solid polythiol containing at least 2 thiol groups per molecule of the general formula:

$$E\!-\!\!\left(-O-\overset{\displaystyle O}{\overset{\|}{C}}-R_3-SH\right)_x$$

wherein $x$ is an integer of at least 2; E is a styrene-allyl alcohol copolymeric moiety remaining after removal of $x$ hydroxyl groups from a styrene-allyl alcohol copolymer to form $x$ ester linkages; said styrene-allyl alcohol copolymer reactant having a hydroxy group content from about 1.8 to 10 percent by weight and a styrene content from about 30 to 94 percent by weight; and $R_3$ is a polyvalent organic radical member free of reactive carbon-to-carbon unsaturation and is selected from the group consisting of aryl, substituted aryl, aralkyl, substituted aralkyl, cycloalkyl, substituted cycloalkyl, alkyl and substituted alkyl group containing 1 to 16 carbon atoms and mixtures thereof; the total combined functionality of (1) the reactive unsaturated carbon to carbon bonds per molecule in the polyene and (2) the thiol groups per molecule in the polythiol being greater than 4, and (3) a photocuring rate accelerator.

2. A composition of claim 1 wherein the $R_3$ radical in said polythiol is selected from the group consisting of $-CH_2-$, $-\overset{|}{C}HCH_3$, and $-CH_2-CH_2-$ and mixtures thereof; and said styrene-allyl alcohol copolymer having an equivalent weight of about 300 ± 130 and a hydroxyl group content from about 4 to 10 percent by weight.

3. A process of forming a solid cross-linked polythioether which comprises admixing:

1. a liquid polyene containing at least 2 reactive unsaturated carbon to carbon bonds 0052about 50 to 20,000;
2. a solid polythiol containing at least 2 thiol groups per molecular of the general formula:

$$E\!-\!\!\left(-O-\overset{\displaystyle O}{\overset{\|}{C}}-R_3-SH\right)_x$$

wherein $x$ is an integer of at least 2; E is a styrene-allyl alcohol copolymeric moiety remaining after removal of $x$ hydroxyl groups from a styrene-allyl alcohol copolymer to form $x$ ester linkages; said styrene-allyl alcohol copolymer reactant having a hydroxy group content from about 30 to 94 percent by weight; and $R_3$ is a polyvalent organic radical member free of reactive carbon-to-carbon unsaturation and is selected from the group consisting of aryl, substituted aryl, aralkyl, substituted aralkyl, cycloalkyl, substituted cycloalkyl, alkyl and substituted alkyl groups containing 1 to 16 carbon atoms and mixtures thereof; the total combined functionality of (1) the reactive unsaturated carbon to carbon bonds per molecule in the polyene and (2) the thiol groups per molecule in the polythiol being greater than 4; and thereafter exposing the mixture to actinic radiation or ionizing radiation.

4. The process of claim 3 wherein the $R_3$ radical in said polythiol is selected from the group consisting of $-CH_2-$, $-\overset{|}{C}HCH_3$, and $-CH_2-CH_2-$ and mixtures thereof; and said styrene-ally alcohol copolymer having an equivalent weight of about 300 ± 130 and a hydroxyl group content from about 4 to 10 percent by weight.

5. The process of claim 3 wherein the mixture is exposed to actinic radiation.

6. The process of claim 5 wherein the actinic radiation is ultraviolet light having a wavelength between about 2,000A and about 4,000°A.

7. The process of claim 5 wherein the composition contains from 0.005 to 50 parts by weight based on 100 parts by weight of said polyene and said polythiol of a photocuring rate accelerator.

8. The process of claim 3 wherein the mixture is exposed to ionizing radiation.

9. The solid product prepared by the process of claim 3.

* * * * *

UNITED STATES PATENT AND TRADEMARK OFFICE
CERTIFICATE OF CORRECTION

PATENT NO. : 3,904,499

DATED : September 9, 1975

INVENTOR(S) : Charles R. Morgan

It is certified that error appears in the above-identified patent and that said Letters Patent are hereby corrected as shown below:

In column 15, lines 47-48, correct "0052about 50 to 20,000;" to read: --and having a molecular weight in the range of about 50 to 20,000;--.

In column 16, line 13, after "about" insert --1.8 to 10 percent by weight and a styrene content from about--.

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*